United States Patent [19]
Tsujihashi

[11] Patent Number: 5,936,427
[45] Date of Patent: Aug. 10, 1999

[54] THREE-INPUT EXCLUSIVE NOR CIRCUIT

[75] Inventor: Yoshiki Tsujihashi, Tokyo, Japan

[73] Assignee: Mitsubishi Denki Kabushiki Kaisha, Tokyo, Japan

[21] Appl. No.: 08/931,891

[22] Filed: Sep. 17, 1997

[30] Foreign Application Priority Data

Apr. 23, 1997 [JP] Japan ................................ 9-106399

[51] Int. Cl.⁶ ................................................ H03K 19/21
[52] U.S. Cl. ........................... 326/54; 326/55; 326/113
[58] Field of Search ........................ 326/17, 52, 54–55, 326/113, 121

[56] References Cited

U.S. PATENT DOCUMENTS

| | | | |
|---|---|---|---|
| 4,559,609 | 12/1985 | Robinson, Jr. et al. | 326/55 |
| 4,575,648 | 3/1986 | Lee | 326/54 |
| 4,749,887 | 6/1988 | Sanwo et al. | 326/55 |
| 4,888,499 | 12/1989 | Sanwo et al. | 326/55 |

FOREIGN PATENT DOCUMENTS 8-288835   11/1996   Japan .

*Primary Examiner*—Jon Santamauro
*Attorney, Agent, or Firm*—Burns, Doane, Swecker & Mathis, LLP

[57] ABSTRACT

A three-input exclusive NOR circuit having three signal paths provided between three input terminals and three-input exclusive OR node, each of the signal paths having two first conduction type transistors connected in series, said two first conduction type transistors being in conductive state when a low level signal is applied to the gate terminal of the transistor; and three signal paths provided between three input terminal and three-input exclusive OR node, each of the signal paths having two second type transistors being in conductive state when a high level signal is applied to the gate terminal of the transistors, wherein two input signals other than the input signal to a signal path is respectively supplied to the gate terminals of two of the first and second conduction type transistors.

10 Claims, 8 Drawing Sheets

FIG.7
| A | B | C | X | Y |
|---|---|---|---|---|
| 0 | 0 | 0 | 0 | 1 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 0 |
FIG.8 (PRIOR ART)
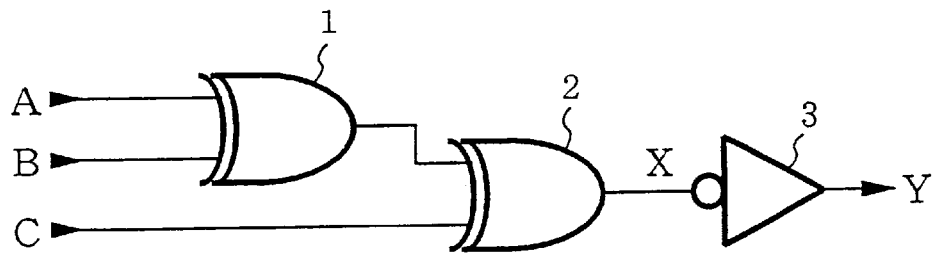
FIG.10 (PRIOR ART)
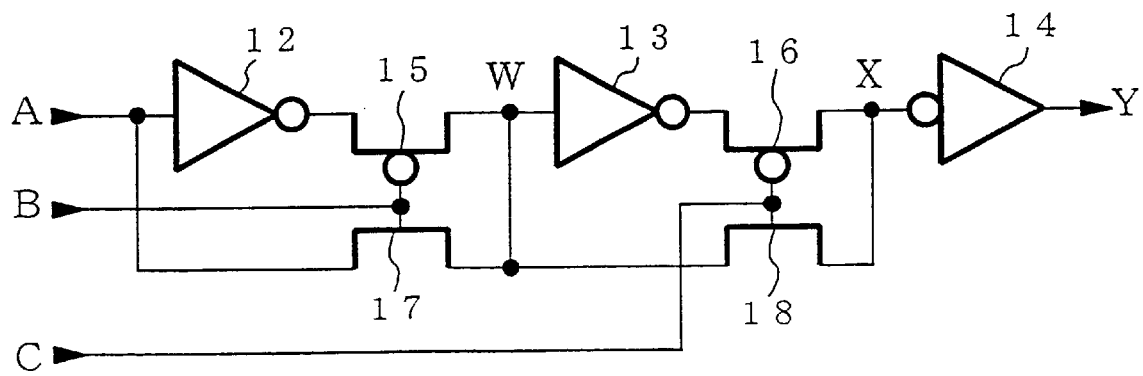

5,936,427

THREE-INPUT EXCLUSIVE NOR CIRCUIT

BACKGROUND OF THE INVENTION

1. Field of the Invention

The present invention relates to a semiconductor circuit, in particular, to a three-input exclusive NOR circuit widely used arithmetic processing or the like.

2. Description of the Prior Art

FIG. 7 is a diagram showing a truth table of a three-input exclusive NOR circuit. Notations A, B and C shown in the figure are input pins of the circuit and notation Y denotes the output pin thereof. It should be noted that notation X is an intermediate node at which a result of exclusive-OR processing of the three inputs appears. It is worth noting that, in the following description, the notations A, B, C, X and Y are also used to denote signals appearing at the input pins, the intermediate node and the output pin denoted by the notations.

FIG. 8 is a diagram showing a three-input exclusive NOR circuit comprising two two-input exclusive OR circuits and an inverter. Reference numerals 1 and 2 denote the two two-input exclusive OR circuits whereas reference numeral 3 is the inverter. It should be noted that the output of the two-input exclusive OR circuit 2 and the inverter 3 are denoted respectively by the notations X and Y shown in the table of FIG. 7.

FIG. 9 is a diagram illustrating the circuit shown in FIG. 8 in detail. It should be noted that components shown in FIG. 9 identical with those shown in FIG. 8 are denoted by the same notations and reference numerals as those used in FIG. 8 and no duplicate explanation is given. Reference numerals 4 to 7 shown in FIG. 9 each denote an inverter for inverting a signal supplied thereto and reference numerals 8 to 11 are each a CMOS transmission gate. In each of the inverters 4 to 7 and the CMOS transmission gates 8 to 11, an n-channel transistor and a p-channel transistor are employed. Thus, there are a total of 18 transistors employed in the circuit.

The explanation of the detailed operation of the circuit is omitted. The value of the signal B puts either the transmission gate 8 or 9 in a conductive state. By the same token, the value of a signal output by the inverter 5 puts either the transmission gate 10 or 11 in a conductive state.

With respect to the speed of the propagation of signals, a path from the input pin A to the output pin Y through the inverter 4, the transmission gate 8, the inverter 5, the transmission gate 10 (or the transmission gate 11) and the inverter 3 is longest, comprising three inverter stages and two transmission-gate stages.

Next, let attention be paid to power consumption. Power consumed by a CMOS circuit can be classified into two main categories. The first category is power caused by a switching current which flows between a power supply and the ground at the time the output of a CMOS logic gate changes. The second category is power due to a charging/discharging current of a capacitive load. Since a switching current flows through each CMOS logic gate, that is, each of the inverters shown in FIG. 9, one way to reduce the amount of consumed power is to decrease the number of CMOS logic gates employed in the circuit in order to reduce the total amount of the switching currents.

FIG. 10 is a diagram showing a conventional three-input exclusive NOR circuit which is obtained by reducing the number of components employed in the circuit shown in FIG. 9. Reference numerals 12 to 14 shown in FIG. 10 each denote an inverter, reference numerals 15 and 16 are each a p-type transmission gate and reference numerals 17 and 18 are each an n-type transmission gate. Notation W denotes an intermediate node. In the case of the circuit shown in FIG. 10, p-type and n-type transmission gates are employed in place of the CMOS transmission gates. The number of n-type transistors is five and the number of p-type transistors is also five to give a total of 10 transistors. With regard to the speed of the propagation of signals, a path from the input pin A to the output pin Y through the inverter 12, the transmission gate 15, the inverter 13, the transmission gate 16 and the inverter 14 is longest, comprising three inverter stages and two transmission-gate stages.

As for power consumption, because the number of inverters employed in the circuit shown in FIG. 10 is smaller than that of the circuit shown in FIG. 9, the total amount of switching current is also smaller. Since n-type or p-type transmission gates are employed, however, the circuit is affected by a substrate-bias effect. For example, there is observed a phenomenon wherein, even if the source terminal of an n-type transmission gate, which is put in a conductive state by setting the gate terminal at the potential of the power supply, is raised to the potential of the power supply, the drain terminal serving as the output of the transmission gate does not rise to the potential of the power supply. By the same token, even if the source terminal of a p-type transmission gate in a conductive state is pulled down to the potential of the ground, the drain terminal serving as the output of the transmission gate will not go down to the potential of the ground. It should be noted that the potentials of the power supply and the ground are also referred to hereafter as logic values "1" and "0" respectively.

For the reason described above, depending upon the combination of the values of the inputs A, B and C, the potentials of nodes W and X shown in the figure can become an intermediate potential, causing a through current to flow through the inverter 13 or 14. Specifically, there are eight possible combinations of the three inputs A, B and C. There is encountered a problem that, for six combinations other than (A, B, C) =(0, 1, 0) and (0, 1, 1), a DC current inevitably flows.

FIG. 11 is a diagram showing a typical conventional circuit which is obtained by improving the circuit shown in FIG. 10 so that this steady-state through current does not flow. The circuit shown in FIG. 10 is improved by inserting inverters 19 and 20 each with a small driving power. The inverters 19 and 20 are used as feedback circuits for pulling up the nodes W and X to the potential of the power supply and pulling down them to the potential of the ground. It should be noted that components of FIG. 11 identical with those employed in the circuit shown in FIG. 10 are denoted by the same reference numerals as those used in FIG. 10 and no duplicate explanation is thus given. The number of p-type transistors is seven and the number of n-type transistors is also seven to give a total of 14 transistors employed in the circuit shown in FIG. 11. Thus, the number of elements is smaller than that in FIG. 9 but the number of inverters remains five, leaving the circuit unimproved as far as the power consumption is concerned.

The conventional three-input exclusive NOR circuit has the configuration described above, giving rise to a problem that the effect of reduction of power consumption is small even if the number of elements is decreased and the speed is not improved either.

SUMMARY OF THE INVENTION

The present invention addresses the problems described above; it is thus an object of the present invention to provide a three-input exclusive NOR circuit that has a high speed, a small element count and little power consumption.

In order to achieve the object of the present invention described above, there is provided a three-input exclusive NOR circuit comprising a logic forming unit for receiving three input signals and generating exclusive OR of the three input signals, and a driving unit for generating the inverted signal of the exclusive OR with the logic forming unit and the driving unit connected to each other through a three-input exclusive OR node wherein:

each of the input signals is supplied to the three-input exclusive OR node through a first transistor signal path and a second transistor signal path;

the first transistor signal path and the second transistor signal path are connected to each other in parallel to provide a total of three the first transistor signal paths and three the second transistor signal paths in the logic forming unit;

each of the first transistor signal paths comprises first and second transistors of a first conduction type connected to each other in series; each of the second transistor signal path comprises first and second transistors of a second conduction type connected to each other in series;

if a low-level signal is applied to a gate terminal of the transistor of the first conduction type, a path between a source terminal and a drain terminal of the transistor of the first conduction type is put in a conductive state;

if a high-level signal is applied to the gate terminal of the transistor of the first conduction type, on the other hand, a path between the source terminal and the drain terminal of the transistor of the first conduction type is put in a non-conductive state;

if a high-level signal is applied to a gate terminal of the transistor of the second conduction type, a path between a source terminal and a drain terminal of the transistor of the second conduction type is put in a conductive state;

if a low-level signal is applied to the gate terminal of the transistor of the second conduction type, a path between the source terminal and the drain terminal of the transistor of the second conduction type is put in a non-conductive state;

the source terminal of the first transistor of the first conduction type in each of the first signal paths serves as an end of the first signal path and the drain terminal of the second transistor of the first conduction type in the second signal path serves as the other end of the first signal path;

the drain terminal of the first transistor of the first conduction type in each of the first signal paths is connected to the source terminal of the second transistor of the first conduction type in the first signal path;

the gate terminals of the first and second transistors of the first conduction type composing each of the first signal paths are connected to two of the three input signals respectively other than the remaining one of the three input signals supplied to the first signal path;

the source terminal of the first transistor of the second conduction type in each of the second signal paths serves as an end of the second signal path and the drain terminal of the second transistor of the second conduction type in the second signal path serves as the other end of the second signal path;

the drain terminal of the first transistor of the second conduction type in each of the second signal paths is connected to the source terminal of the second transistor of the second conduction type in the second signal path; and the gate terminals of the first and second transistors of the second conduction type composing each of the second signal paths are connected to two of the three input signals respectively other than the remaining one of the three input signals supplied to the second signal path. As a result, the present invention exhibits an effect that it is possible to implement an exclusive NOR circuit with a small number of components which result in low power consumption and high-speed operations.

According to an aspect of the present invention, there is provided a three-input exclusive NOR circuit wherein the logic forming unit comprises the three first signal paths each comprising the first transistor of the first conduction type and the second transistor of the first conduction type connected to each other in series with the first and second transistors of the first conduction type composing any one of the first signal paths different from the first and second transistors of the first conduction type composing the other two of the first signal paths, and the three second signal paths each comprising the first transistor of the second conduction type and the second transistor of the second conduction type connected to each other in series with the first and second transistors of the second conduction type composing any one of the second signal paths different from the first and second transistors of the second conduction type composing the other two of the second signal paths. As a result, the present invention exhibits an effect that it is possible to implement an exclusive NOR circuit with a small number of components which result in low power consumption and high-speed operations.

According to another aspect of the present invention, there is provided a three-input exclusive NOR circuit wherein one of the first and second transistors of the first conduction type composing one of the three first signal paths is shared by another one of the first signal paths with the input signal thereof not applied to the gate terminal of the shared transistor of the first conduction type and the drain terminal of the shared transistor of the first conduction type is connected to the three-input exclusive OR node, or, one of the first and second transistors of the second conduction type composing one of the three second signal paths is shared by another one of the second signal paths with the input signal thereof not applied to the gate terminal of the shared transistor of the second conduction type and the drain terminal of the shared transistor of the second conduction type is connected to the three-input exclusive OR node. As a result, the present invention exhibits an effect that it is possible to implement an exclusive NOR circuit with an even smaller number of components which result in a reduced input load capacity and higher-speed operations.

According to still another aspect of the present invention, there is provided a three-input exclusive NOR circuit wherein one of the first and second transistors of the first conduction type composing one of the three first signal paths is shared by another one of the first signal paths with the input signal thereof not applied to the gate terminal of the shared transistor of the first conduction type, one of the first and second transistors of the second conduction type composing one of the three second signal paths is shared by another one of the second signal paths with the input signal thereof not applied to the gate terminal of the shared transistor of the second conduction type and the gate terminals of the shared transistors of the first and second types are connected to the same one of the three input signals. As a result, the present invention exhibits an effect that it is possible to implement an exclusive NOR circuit with an even smaller number of components which result in a reduced input load capacity and higher-speed operations.

According to a still further aspect of the present invention, there is provided a three-input exclusive NOR circuit wherein one of the first and second transistors of the first conduction type composing one of the three first signal paths is shared by another one of the first signal paths with the input signal thereof not applied to the gate terminal of the shared transistor of the first conduction type, one of the first and second transistors of the second conduction type composing one of the three second signal paths is shared by another one of the second signal paths with the input signal thereof not applied to the gate terminal of the shared transistor of the second conduction type and the gate terminals of the shared transistors of the first and second types are connected to two of the three input signals different from each other. As a result, the present invention exhibits an effect that it is possible to implement an exclusive NOR circuit with an even smaller number of components which result in a reduced input load capacity of specific input lines and higher-speed operations.

According to a still further aspect of the present invention, there is provided a three-input exclusive NOR circuit wherein an inverting logic circuit is provided in the driving unit which is used for generating the inverted signal of the exclusive OR and the inverting logic circuit serves as a feedback circuit receiving a signal output by the driving unit as an input thereof and outputting a signal to the driving unit. As a result, the present invention exhibits an effect that it is possible to implement an exclusive NOR circuit which is capable of preventing a through current from flowing and consumes a small amount of power.

BRIEF DESCRIPTION OF THE DRAWINGS

Preferred embodiments of the present invention will be described with reference to the following figures wherein:

FIG. 7 is a diagram showing a truth table of exclusive NOR processing of three inputs;

FIG. 8 is a diagram showing the configuration of a conventional three-input exclusive NOR circuit comprising two two-input exclusive OR circuits;

FIG. 10 is a diagram showing a conventional three-input exclusive NOR circuit obtained by reducing the number of elements of the conventional three-input exclusive NOR circuit shown in FIG. 9.

DETAILED DESCRIPTION OF THE PREFERRED EMBODIMENTS

The present invention will become more apparent from a study of the following detailed description of preferred embodiments with reference to the accompanying diagrams briefly explained above.

First Embodiment

Figure 1:
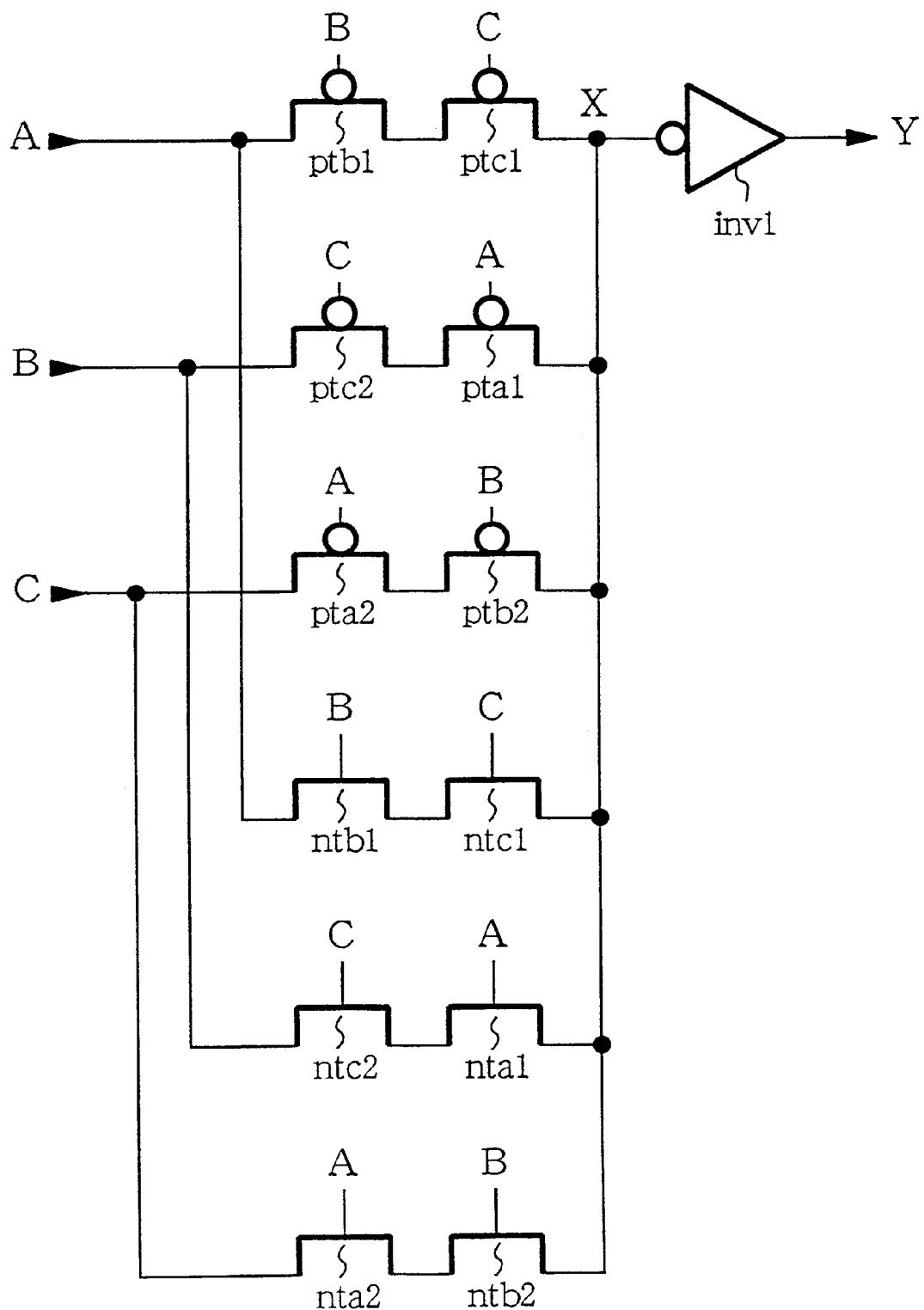
FIG. 1 is a diagram showing a three-input exclusive NOR circuit implemented by a first embodiment of the present invention.
Figure 2:
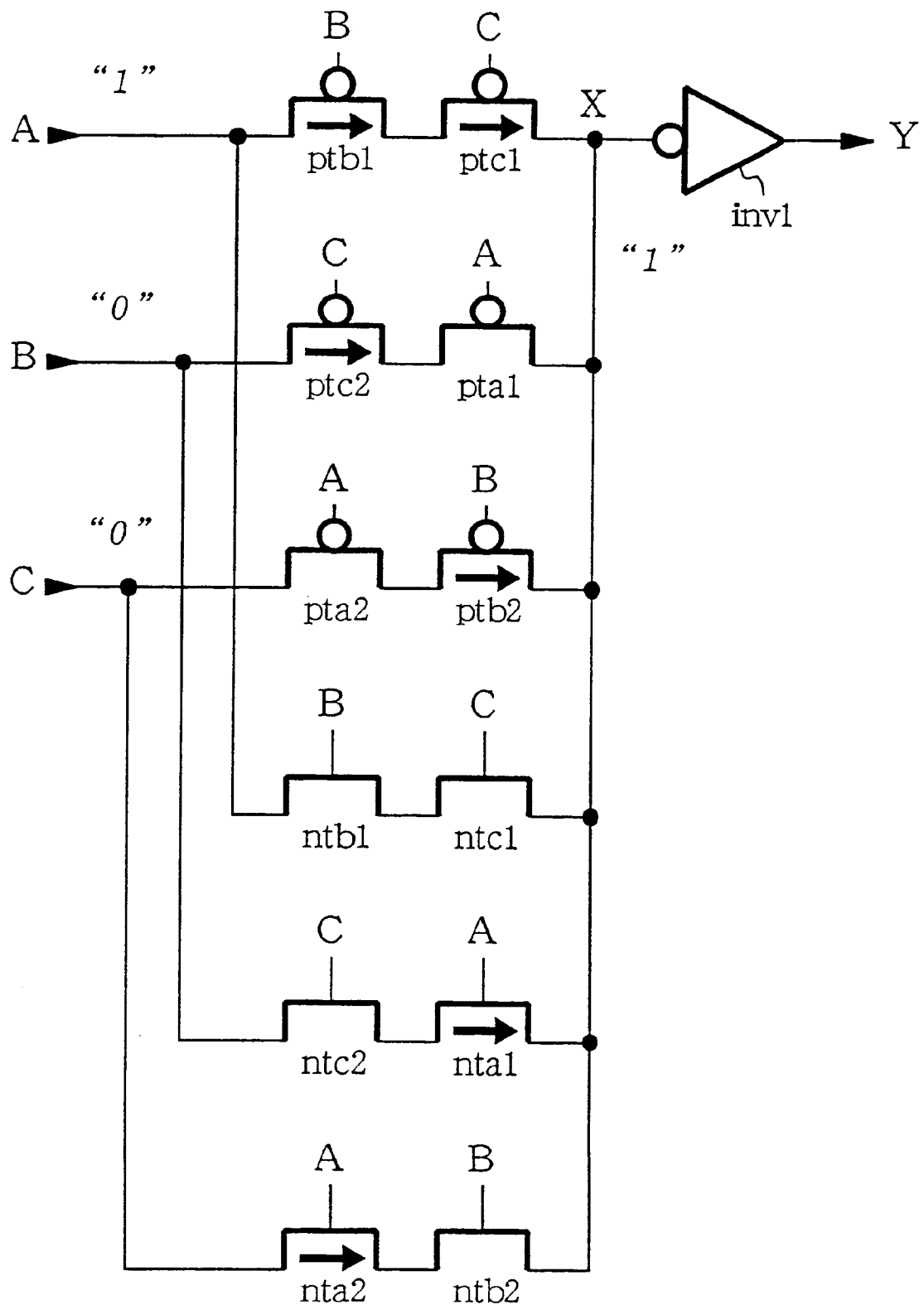
FIG. 2 is a diagram used for explaining the operation of the three-input exclusive NOR circuit shown in FIG. 1.
Figure 3:
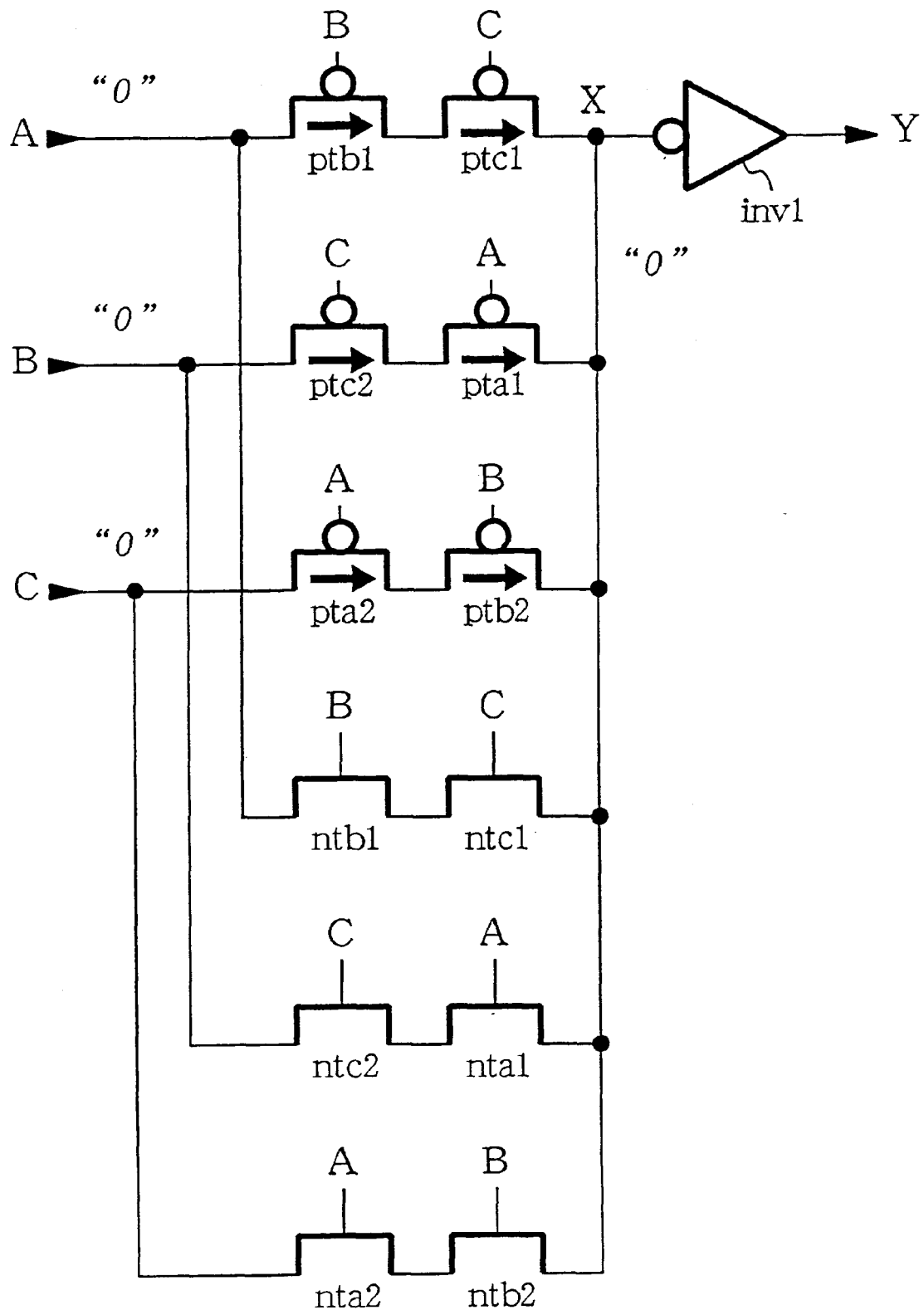
FIG. 3 is another diagram used for explaining the operation of the three-input exclusive NOR circuit shown in FIG. 1.

FIG. 1 is a diagram showing a three-input exclusive NOR circuit implemented by a first embodiment of the present invention whereas FIGS. 2 and 3 are diagrams used for explaining the operation of the three-input exclusive NOR circuit shown in FIG. 1. Notations pta1, pta2, ptb1, ptb2, ptc1 and ptc2 shown in the figures each denote a p-type transmission gate (or a transistor of a first conduction type) whereas notations nta1, nta2, ntb1, ntb2, ntc1 and ntc2 each denote an n-type transmission gate (or a transistor of a second conduction type). Notation inv1 is a driving inverter for inverting a signal to be output by the circuit. Notations A, B and C are the three input terminals of the three-input exclusive NOR circuit, notation X is an intermediate node in front of the inverter inv1 and notation Y is the output terminal of the three-input exclusive NOR circuit. In the following description, the notations A, B, C, X and Y are also used for denoting signals appearing at the input terminals, the node and the output terminal denoted by the notations. It should be noted that each arrow appended to a transmission gate shown in FIGS. 2 and 3 indicates that the transmission gate is put in a conductive state.

As shown in FIG. 1, there are two signal propagation paths between each of the input terminals A, B and C and the node X to give a total of six paths. The six paths are described as follows:

1. From A to X
A→ptb1→ptc1→X and A→ntb1→ntc1→X
2. From B to X
B→ptc2→pta1→X and B→ntc2→nta1→X
3. From C to X
C→pta2→ptb2→X and C→nta2→ntb2→X Each signal path comprises either two n-type or p-type transmission gates connected to each other in series. The gate terminals of two transmission gates constituting a signal propagation path between an input terminal and the node X are driven by signals supplied from the other input terminals to put the transmission gates in an on or off state. For example, the gate terminals of the transmission gates ptb1 and ptc1 constituting a signal propagation path between the input terminal A and the node X are driven by signals supplied from the input terminals B and C respectively.

The number of p-type transistors is seven and the number of n-type transistors is also seven to give a total of 14 transistors employed in the three-input exclusive NOR circuit shown in FIG. 1. The only component through which a switching current flows is the inverter inv1.

FIG. 2 is a diagram used for explaining the operation of the three-input exclusive NOR circuit shown in FIG. 1 for a combination of the inputs (A, B, C)=(1, 0, 0). In this state, the transmission gates ptb1, ptb2, ptc1, ptc2, nta1 and nta2 are put in a conductive state and only the signal propagation path A→ptb1→ptc1→X, one of the six paths, is activated, putting the node X at the logic value "1". Likewise, for combinations of the inputs (A, B, C)=(0, 0, 1), (0, 1, 0), (0, 1, 1), (1, 0, 1) and (1, 1, 0), that is, combinations of the inputs wherein two of the inputs are the logic value "1" or "0", only one of the six signal propagation paths is activated, propagating a signal from the input terminal connected to the propagation path to the node X.

FIG. 3 is another diagram used for explaining the operation of the three-input exclusive NOR circuit shown in FIG. 1 for a combination of the inputs (A, B, C)=(0, 0, 0). In this state, the transmission gates pta1, pta2, ptb1, ptb2, ptc1 and ptc2 are put in a conductive state and, among the six signal propagation paths, the paths A→ptb1→ptc1→X, B→ptc2→pta1→X and C→pta2→ptb2→X are activated. Since A=B=C=0, however, X also becomes 0. For a combination of the inputs (A, B, C)=(1, 1, 1), the transmission gates nta1, nta2, ntb1, ntb2, ntc1 and ntc2 are put in a conductive state and, among the six signal propagation paths, the paths A→ntb1→ntc1→X, B→ntc2→nta1→X and C→nta2→ntb2→X are activated. Since A=B=C=1, however, X also becomes 1.

That is to say, according to the logic characteristic of an exclusive OR of the three inputs for combinations of the three inputs wherein two of the three inputs have the same logic value, in the three-input exclusive NOR circuit implemented by the first embodiment, each two n-type or p-type transmission gates are connected in series so that, when two or the three inputs A, B and C have the same logic value, a signal propagation path connecting the remaining input terminal to the three-input exclusive OR node is activated.

In this way, a signal output from the node X of the three-input OR of signals supplied from the input terminals A, B and C is generated by a circuit shown in FIG. 1. Furthermore, the signal appearing at the node X is inverted by the inverter inv1 for driving the signal and output from the output terminal Y as an exclusive NOR of the three inputs. In the operation of the circuit described above, the delay time is the same regardless of which path the signals are propagated since all the signal propagation paths each comprise two transmission-gate stages and one inverter stage, allowing operations to be executed at a high speed.

Second Embodiment

In the first embodiment, for a combination of the inputs (A, B, C)=(0, 0, 0) or (1, 1, 1), a signal "0" propagates through p-type transmission gates or a signal "1" propagates through n-type transmission gates. As a result, the node X is affected by a substrate-bias effect, being set at an intermediate potential. In this state, a through current flows through the inverter inv1. In order to solve this problem, a second embodiment is obtained by improving the first embodiment so that no such through current flows through the inverter inv1.

Figure 4:
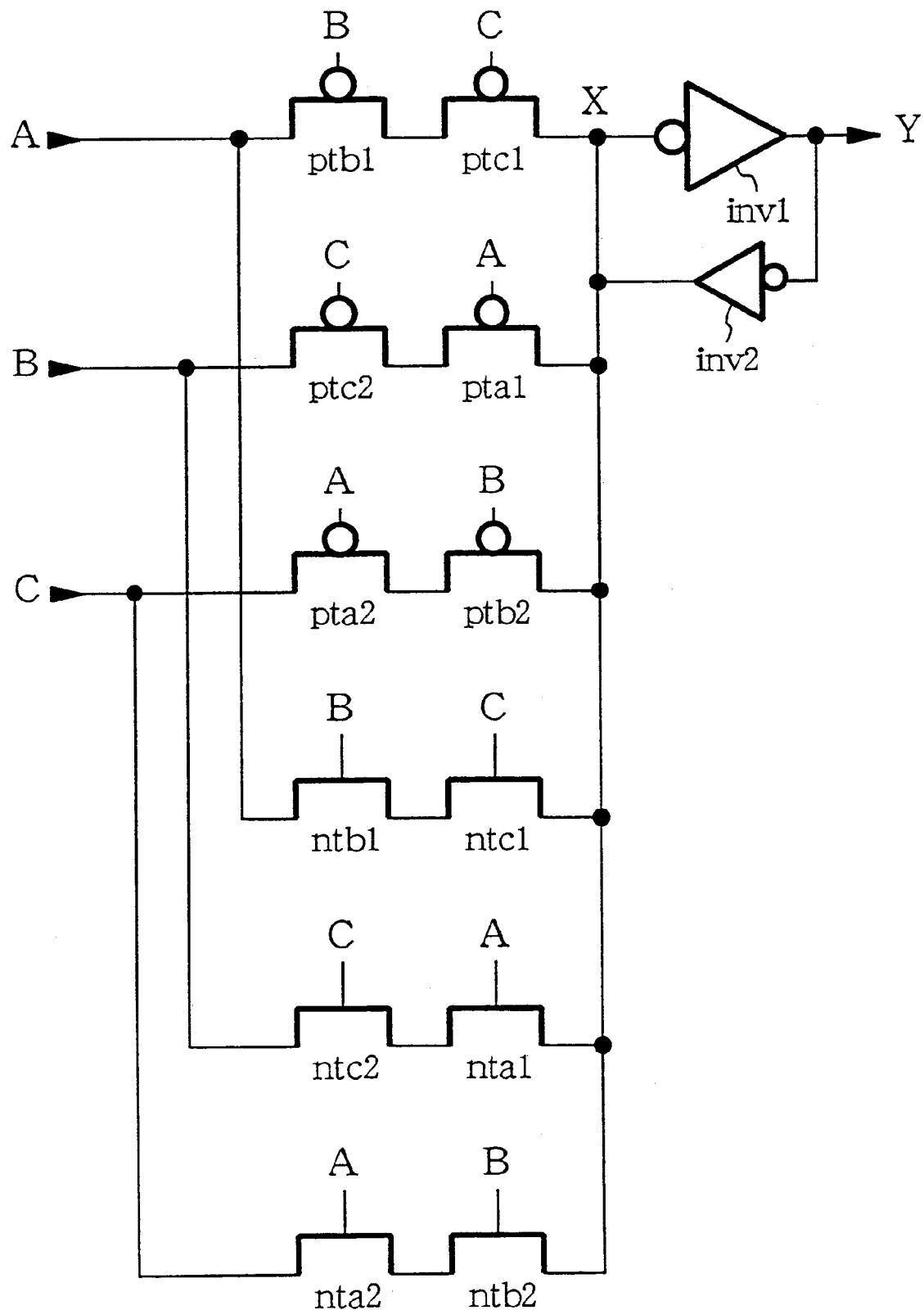
FIG. 4 is a diagram showing a three-input exclusive NOR circuit implemented by a second embodiment of the present invention.

FIG. 4 is a diagram showing the configuration of a three-input exclusive NOR circuit implemented by a second embodiment of the present invention wherein such through current is prevented from flowing. As shown in the figure, an inverter inv2 with a low driving power is inserted between the node X and the output terminal Y. By setting the driving power of the inverter inv2 at a sufficiently small value, the node X can be pulled up to the potential of the power supply or pulled down to the potential of the ground in comparison to the circuit shown in FIG. 1, allowing the through current to be eliminated.

Third Embodiment

Figure 5:
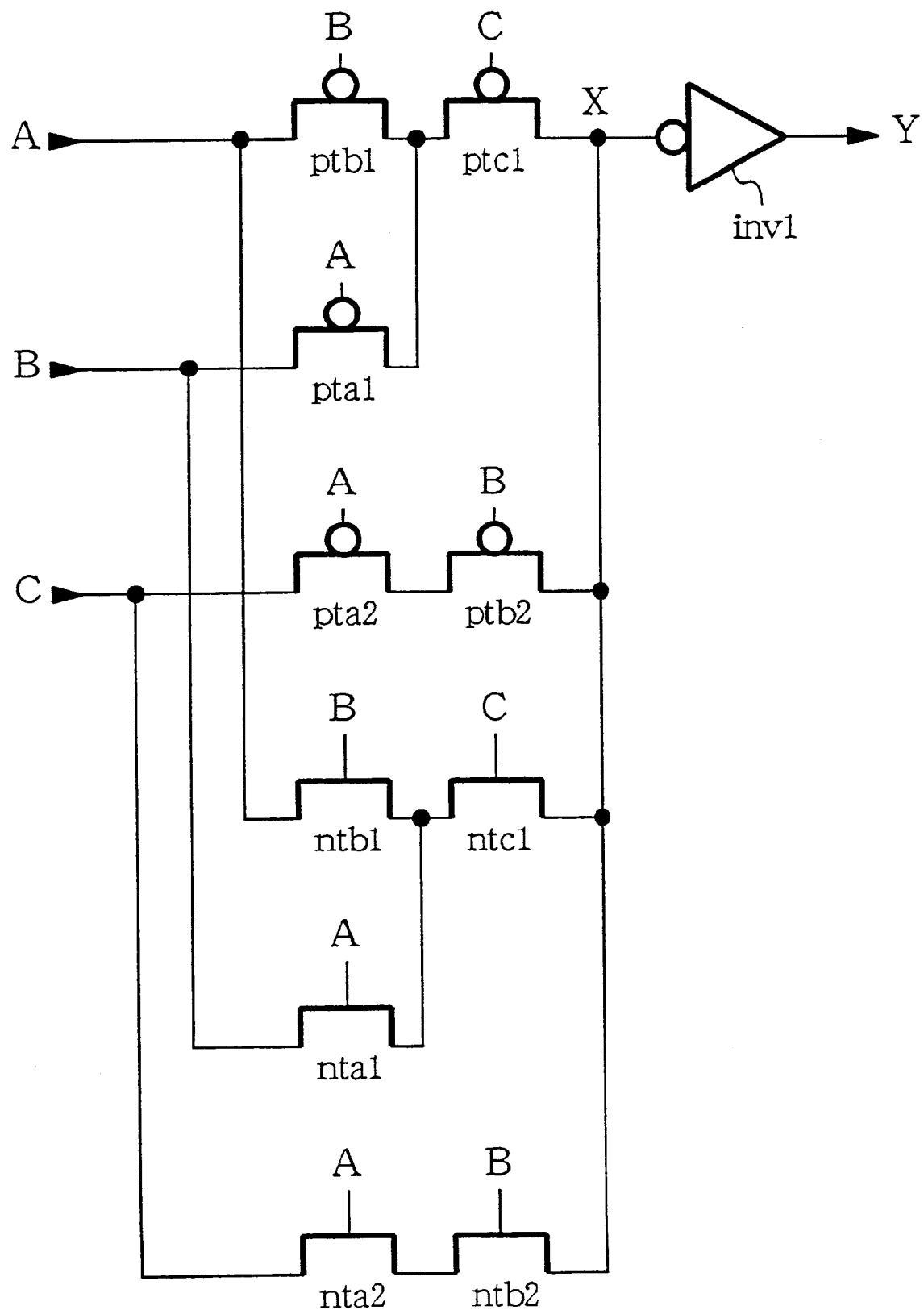
FIG. 5 is a diagram showing a three-input exclusive NOR circuit implemented by a third embodiment of the present invention.

FIG. 5 is a diagram showing the configuration of a three-input exclusive NOR circuit implemented by a third embodiment of the present invention. As shown in the figure, in the case of the third embodiment, the transmission gate ptc1 is shared by the signal propagation path A→ptb1→ptc1→X and the signal propagation path B→ptc2→pta1→X of the first embodiment shown in FIG. 1, allowing the transmission gate ptc2 to be eliminated. By the same token, the transmission gate ntc1 is shared by the signal propagation path A→ntb1→ntc1→X and the signal propagation path B→ntc2→nta1→X of the first embodiment, allowing the transmission gate ntc2 to be eliminated. As a result, the number of transistors can be reduced.

The operation of the third embodiment is the same as that of the first embodiment. Specifically, there are two signal propagation paths between each of the input terminals A, B and C and the node X at the input of the inverter inv1 for driving the output Y of the three-input exclusive NOR circuit to give a total of six paths. The six paths are described as follows:

1. From A to X
   A→ptb1→ptc1→X and A→ntb1→ntc1→X
2. From B to X
   B→pta1→ptc1→X and B→nta1→ntc1→X
3. From C to X
   C→pta2→ptb2→X and C→nta2→ntb2→X Each of the signal propagation paths comprises either two n-type or p-type transmission gates connected to each other in series. The gate terminals of two transmission gates constituting a signal propagation path between an input terminal and the node X are driven by signals supplied from the other input terminals to put the transmission gates in an on or off state. For example, for a combination of the inputs (A, B, C)=(1, 0, 0). In this state, the transmission gates ptb1, ptb2, ptc1, nta1 and nta2 are put in a conductive state and only the signal propagation path A→ptb1→ptc1→X, one of the six paths, is activated, putting the node X at the logic value "1".

The third embodiment has the same number of delay stages as the first embodiment but includes fewer components. As a result, the capacity of the node X can be reduced, allowing the speed to be increased and the amount of consumed power to be decreased. In addition, since the input load capacity of the input terminal C is reduced in comparison to the input terminals A and B, the designer of the semiconductor integrated circuit can connect the input terminal C to a signal line, the capacitive load of which needs to be reduced. In this way, the designer can expect an effect of increasing the speed and decreasing the amount of consumed power of the semiconductor integrated circuit as a whole which employs the three-input exclusive NOR circuit provided by the present invention.

It should be noted that, much like the second embodiment, an inverter with a weak driving power can be inserted between the node X and the output terminal Y in the third embodiment in order to eliminate the through current.

Fourth Embodiment

Figure 6:
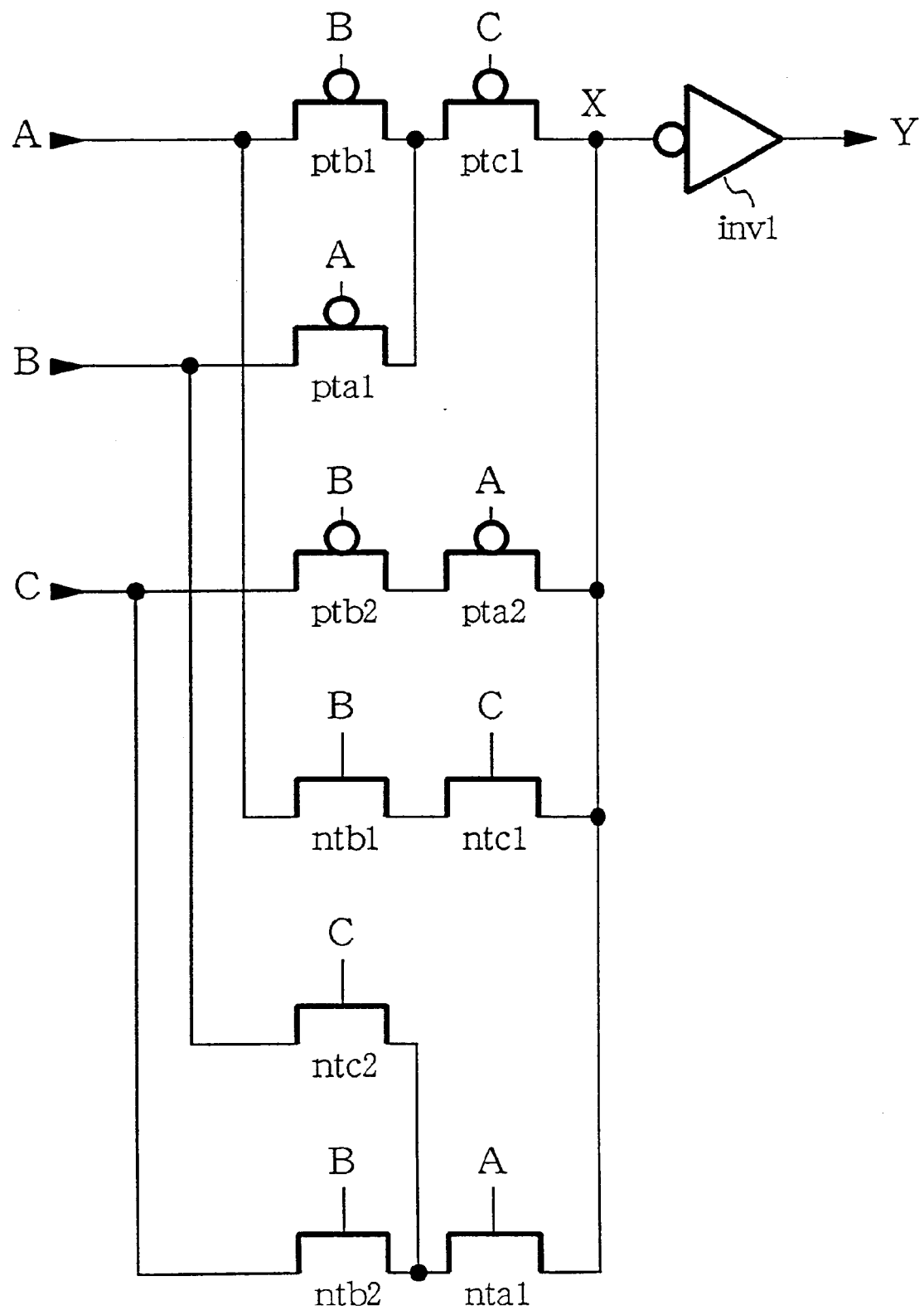
FIG. 6 is a diagram showing a three-input exclusive NOR circuit implemented by a fourth embodiment of the present invention.
Figure 9:
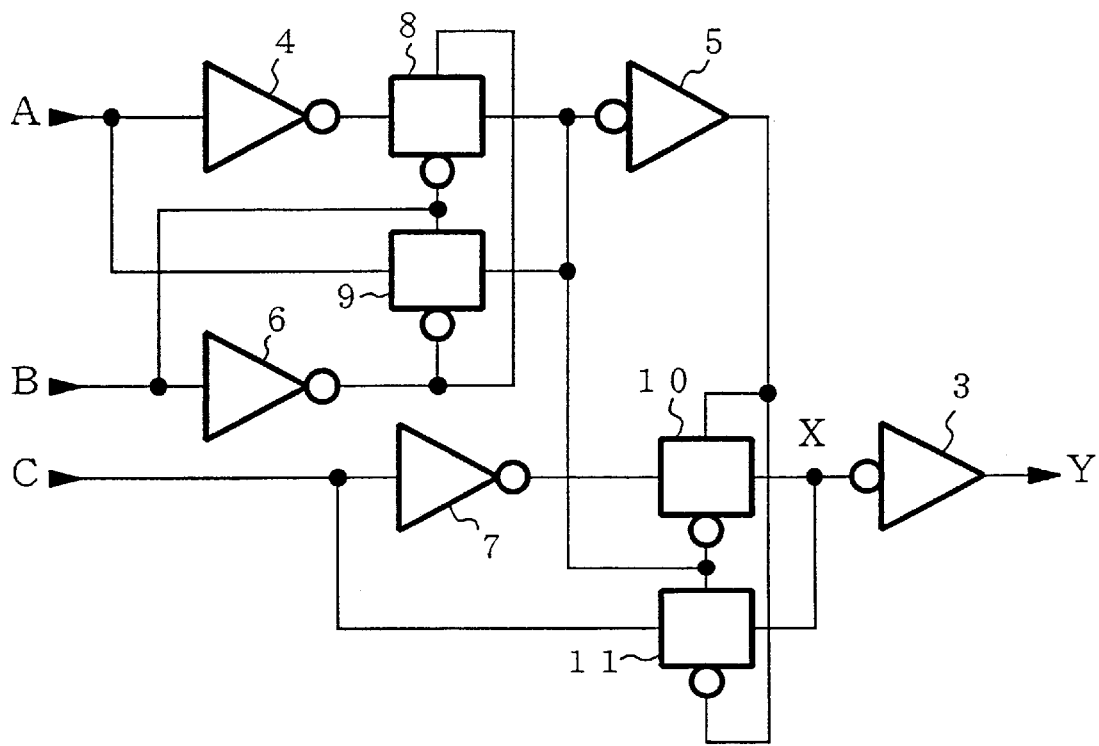
FIG. 9 is a diagram showing a detailed configuration of the conventional three-input exclusive NOR circuit shown in FIG. 8.
Figure 11:
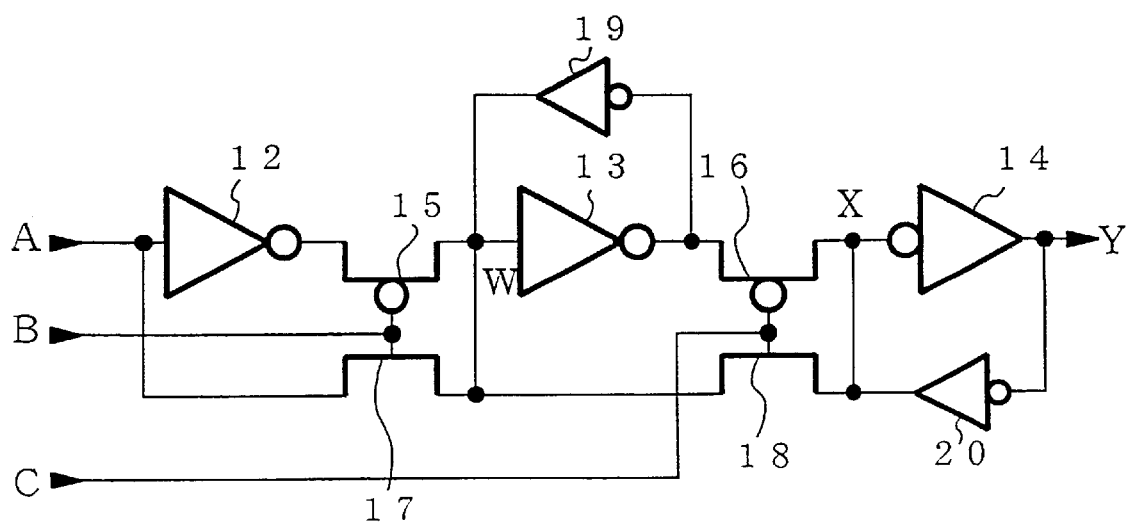
FIG. 11 is a diagram showing a conventional three-input exclusive NOR circuit obtained by improving the conventional three-input exclusive NOR circuit shown in FIG. 10 in such a way that no direct current flows.

FIG. 6 is a diagram showing the configuration of a three-input exclusive NOR circuit implemented by a fourth embodiment of the present invention. As shown in the figure, in the case of the fourth embodiment, the transmission gate ptc1 is shared by the signal propagation path A→ptb1→ptc1→X and the signal propagation path B→ptc2→pta1→X of the first embodiment shown in FIG. 1, allowing the transmission gate ptc2 to be eliminated. By the same token, the transmission gate nta1 is shared by the signal propagation path B→ntc2→nta1→X and the signal propagation path C→nta2→ntb2→X of the first embodiment, allowing the transmission gate nta2 to be eliminated. As a result, the number of transistors can be reduced.

The operation of the fourth embodiment is the same as that of the first embodiment as the operation of the third embodiment is the same as that of the first embodiment as described above. The third embodiment has the same number of delay stages as the first embodiment but includes fewer components. As a result, the capacity of the node X can be reduced, allowing the speed to be increased and the amount of consumed power to be decreased. In addition, since the input load capacities of the input terminals A and C are reduced in comparison to the input terminal B, the designer of the semiconductor integrated circuit can connect the input terminals A and C to signal lines, the capacitive loads of which need to be reduced. In this way, the designer can expect an effect of increasing the speed and decreasing the amount of consumed power of the semiconductor integrated circuit as a whole which employs the three-input exclusive inverting logical-sum circuit provided by the present invention.

It should be noted that, much like the second embodiment, an inverter with a weak driving power can be inserted between the node X and the output terminal Y in the fourth embodiment in order to eliminate the through current.

What is claimed is:

1. A three-input exclusive NOR circuit comprising a logic forming unit for receiving three input signals and generating exclusive OR of said three input signals and a driving unit for generating exclusive OR the inverted signal of said exclusive OR with said logic forming unit and said driving unit connected to each other through a three-input exclusive OR node wherein:

each of the input signals is supplied to said three-input exclusive OR node through a first transistor signal path and a second transistor signal path;

said first transistor signal path and said second transistor signal path are connected to each other in parallel to provide a total of three said first transistor signal paths and three said second transistor signal paths in said logic forming unit;

each of said first transistor signal paths comprises first and second transistors of a first conduction type connected to each other in series;

each of said second transistor signal paths comprises first and second transistors of a second conduction type connected to each other in series;

if a low-level signal is applied to a gate terminal of said transistor of said first conduction type, a path between a source terminal and a drain terminal of said transistor of said first conduction type is put in a conductive state;

if a high-level signal is applied to said gate terminal of said transistor of said first conduction type, on the other hand, a path between said source terminal and said drain terminal of said transistor of said first conduction type is put in a non-conductive state;

if a high-level signal is applied to a gate terminal of said transistor of said second conduction type, a path between a source terminal and a drain terminal of said transistor of said second conduction type is put in a conductive state;

if a low-level signal is applied to said gate terminal of said transistor of said second conduction type, on the other hand, a path between said source terminal and said drain terminal of said transistor of said second conduction type is put in a non-conductive state;

said source terminal of said first transistor of said first conduction type in each of said first signal paths serves as an end of said first signal path and said drain terminal of said second transistor of said first conduction type in said first signal path serves as the other end of said first signal path;

said drain terminal of said first transistor of said first conduction type in each of said first signal paths is connected to said source terminal of said second transistor of said first conduction type in said first signal path;

said gate terminals of said first and second transistors of said first conduction type composing each of said first signal paths are connected to two of said three input signals respectively other than the remaining one of said three input signals supplied to said first signal path;

said source terminal of said first transistor of said second conduction type in each of said second signal paths serves as an end of said second signal path and said drain terminal of said second transistor of said second conduction type in said second signal path serves as the other end of said second signal path;

said drain terminal of said first transistor of said second conduction type in each of said second signal paths is connected to said source terminal of said second transistor of said second conduction type in said second signal path; and said gate terminals of said first and second transistors of said second conduction type composing each of said second signal paths are connected to two of said three input signals respectively other than the remaining one of said three input signals supplied to said second signal path.

2. A three-input exclusive NOR circuit according to claim 1 wherein said logic forming unit comprises said three first signal paths each comprising said first transistor of said first conduction type and said second transistor of said first conduction type connected to each other in series with said first and second transistors of said first conduction type composing any one of said first signal paths different from said first and second transistors of said first conduction type composing the other two of said first signal paths, and said three second signal paths each comprising said first transistor of said second conduction type and said second transistor of said second conduction type connected to each other in series with said first and second transistors of said second conduction type composing any one of said second signal paths different from said first and second transistors of said second conduction type composing the other two of said second signal paths.

3. A three-input exclusive NOR circuit according to claim 1 wherein one of said first and second transistors of said first conduction type composing one of said three first signal paths is shared by another one of said first signal paths with said input signal thereof not applied to said gate terminal of said shared transistor of said first conduction type and said drain terminal of said shared transistor of said first conduction type is connected to said three-input exclusive OR node, or, one of said first and second transistors of said second conduction type composing one of said three second signal paths is shared by another one of said second signal paths with said input signal thereof not applied to said gate terminal of said shared transistor of said second conduction type and said drain terminal of said shared transistor of said second conduction type is connected to said three-input exclusive OR node.

4. A three-input exclusive NOR circuit according to claim 3 wherein one of said first and second transistors of said first conduction type composing one of said three first signal paths is shared by another one of said first signal paths with said input signal thereof not applied to said gate terminal of said shared transistor of said first conduction type, one of said first and second transistors of said second conduction type composing any one of said three second signal paths is shared by another one of said second signal paths with said input signal thereof not applied to said gate terminal of said shared transistor of said second conduction type, and, said gate terminals of said shared transistors of said first and second types are connected to the same one of said three input signals.

5. A three-input exclusive NOR circuit according to claim 3 wherein one of said first and second transistors of said first conduction type composing one of said three first signal paths is shared by another one of said first signal paths with said input signal thereof not applied to said gate terminal of said shared transistor of said first conduction type, one of said first and second transistors of said second conduction type composing one of said three second signal paths is shared by another one of said second signal paths with said input signal thereof not applied to said gate terminal of said shared transistor of said second conduction type, and, said gate terminals of said shared transistors of said first and second types are connected to two of said three input signals different from each other.

6. A three-input exclusive NOR circuit according to claim 1, wherein an inverting logic circuit is provided in said driving unit which is used for generating the inverted signal of said exclusive OR, and said inverting logic circuit serves as a feedback circuit receiving a signal output by said driving unit as an input thereof and outputting a signal to said driving unit.

7. A three-input exclusive NOR circuit according to claim 2 wherein an inverting logic circuit is provided in said driving unit which is used for generating the inverted signal of said exclusive OR, and said inverting logic circuit serves as a feedback circuit receiving a signal output by said driving unit as an input thereof and outputting a signal to said driving unit.

8. A three-input exclusive NOR circuit according to claim 3 wherein an inverting logic circuit is provided in said driving unit which is used for generating the inverted signal of said exclusive OR, and said inverting logic circuit serves as a feedback circuit receiving a signal output by said driving unit as an input thereof and outputting a signal to said driving unit.

9. A three-input exclusive NOR circuit according to claim 4 wherein an inverting logic circuit is provided in said driving unit which is used for generating the inverted signal of said exclusive or, and said inverting logic circuit serves as a feedback circuit receiving a signal output by said driving unit as an input thereof and outputting a signal to said driving unit.

10. A three-input exclusive NOR circuit according to claim 5 wherein an inverting logic circuit is provided in said driving unit which is used for generating the inverted signal of said exclusive OR, and said inverting logic circuit serves as a feedback circuit receiving a signal output by said driving unit as an input thereof and outputting a signal to said driving unit.

* * * * *